US006862239B1

(12) United States Patent
Huang et al.

(10) Patent No.: US 6,862,239 B1
(45) Date of Patent: Mar. 1, 2005

(54) CIRCUIT AND METHOD FOR SELF-REFRESH OF DRAM CELLS THROUGH MONITORING OF CELL LEAKAGE CURRENTS

(75) Inventors: Chien-Hua Huang, Hsinchu (TW); Chung-Cheng Chou, Hsinchu (TW)

(73) Assignee: Taiwan Semiconductor Manufacturing Company, Limited, Hsin-Chu (TW)

( * ) Notice: Subject to any disclaimer, the term of this patent is extended or adjusted under 35 U.S.C. 154(b) by 0 days.

(21) Appl. No.: 10/696,291

(22) Filed: Oct. 29, 2003

(51) Int. Cl.[7] .................................................. G11C 7/00
(52) U.S. Cl. ............. 365/222; 365/189.09; 365/189.11; 365/233
(58) Field of Search ........................... 365/222, 189.09, 365/233, 189.11, 189.06

(56) References Cited

U.S. PATENT DOCUMENTS

| 5,283,764 | A | * | 2/1994 | Kim et al. ................... 365/222 |
| 6,003,118 | A | | 12/1999 | Chen .......................... 711/167 |
| 6,404,687 | B2 | * | 6/2002 | Yamasaki .................... 365/222 |
| 6,597,614 | B2 | * | 7/2003 | Nam et al. ................... 365/222 |
| 6,603,697 | B2 | * | 8/2003 | Janzen ........................ 365/222 |
| 6,603,698 | B2 | * | 8/2003 | Janzen ........................ 365/222 |
| 6,707,744 | B2 | * | 3/2004 | Jo ............................... 365/222 |
| 2002/0000581 | A1 | | 1/2002 | Yamasaki .................... 365/222 |
| 2002/0009010 | A1 | | 1/2002 | Hayakawa ................... 365/222 |
| 2002/0018387 | A1 | | 2/2002 | Nam et al. ................... 365/222 |
| 2003/0067827 | A1 | | 4/2003 | Janzen ........................ 365/222 |
| 2003/0067828 | A1 | | 4/2003 | Janzen ........................ 365/222 |
| 2003/0107938 | A1 | | 6/2003 | Jo ............................... 365/222 |

* cited by examiner

*Primary Examiner*—Andrew Q. Tran
(74) *Attorney, Agent, or Firm*—Duane Morris LLP

(57) ABSTRACT

A circuit and a method for self refresh of DRAM cells are provided. The circuit comprises a bias generator and an oscillator. The bias generator comprises a first current generator, a second current generator and a converter. The first current generator generates a first leakage current of "0" state cells. The second current generator generates a second leakage current of "1" state cells. The converter transforms a current comprising the first leakage current and the second leakage current into output biases. The method comprises generating leakage currents from memory cells; transforming the leakage currents into output biases for determining a self refresh period; and using the output biases to control an oscillator for generating a periodical signal pulse in response to the leakage currents.

35 Claims, 7 Drawing Sheets

CIRCUIT AND METHOD FOR SELF-REFRESH OF DRAM CELLS THROUGH MONITORING OF CELL LEAKAGE CURRENTS

FIELD OF THE INVENTION

The present invention relates to a circuit and its method of use for semiconductor integrated circuits; more particularly, the present invention relates to a circuit and a method for self refresh of dynamic random access memory (DRAM) cells.

DESCRIPTION OF THE RELATED ART

In dynamic random access memory (DRAM), one cell structure in a DRAM array is predominantly made of one-transistor memory cells, each of which comprises a selection transistor and a storage capacitor. The selection transistor serves as a switch and the capacitor is used for storing electric charges which represent data. For example, the terminal voltage of the capacitor determines the binary information stored therein. A high terminal voltage could represent a "1" and a low terminal voltage could represent a "0" or the opposite could be the case. A "write" operation is performed when a voltage corresponding to the binary information is applied to the memory cell. A "read" operation occurs when the existence or absence of a capacitor charge is determined by a sensing circuit by comparing the capacitor's voltage or the current produced from the capacitor with a reference point, e.g. current, thereby providing a signal indicative thereof. A voltage difference may be created on a bit line of the accessed memory bit cell and a reference bit line.

A drawback of DRAM resides in the fact that since the information is stored in terms of an electrical charge in the memory cell capacitor, the information is subjected to being lost, primarily due to the inevitable leakages of charges across the semiconductor junctions. Due to the charge leakage, it is necessary to perform a periodic refresh operation of the information stored in each memory cell with a prescribed time period, so as to restore the prescribed electrical charge of the capacitor. The time period for cell refresh is related to numerous factors, e.g. the process or structure of the capacitor, operation voltage, and/or temperature.

U.S. Pub. Pat. Application No. 2002/0018387, titled "Self Refresh Circuit for a Semiconductor Memory Device," disclosed a self refresh circuit for semiconductor memory device. As illustrated in FIG. 1, the circuit comprises a temperature sensing unit 120 and a ring oscillator unit 130. The temperature sensing unit 120 can sense a temperature and generate a bias current for adjusting a self refresh period according to a data holding time of a memory cell varied by the temperature. The ring oscillator unit 130 can generate a pulse signal having a period actively varied according to the temperature by the bias current from the temperature sensing unit 120.

The temperature sensing unit 120 comprises a first reference voltage generating unit 122 for generating a reference voltage $V_R$ having a negative (−) property (inversely proportional) to temperature variations; a second reference voltage unit 124 receives the output signal from the first reference voltage generating unit 122, and generates a reference voltage $V_F$ having a positive (+) property (proportional) to temperature variations; and a third reference voltage generating unit 126 receives the output signal $V_F$ from the second reference voltage generating unit 124, and generates an inverted signal of the signal $V_F$. The output signal from the second and third reference voltage generating units 124, 126 can control the operation of the ring oscillator unit 130. However, this related art did not disclose a circuit or a method for self refresh of dynamic random access memory (DRAM) by monitoring leakage currents generated from DRAM cells.

DESCRIPTION OF A PREFERRED EMBODIMENT

Figure 1:
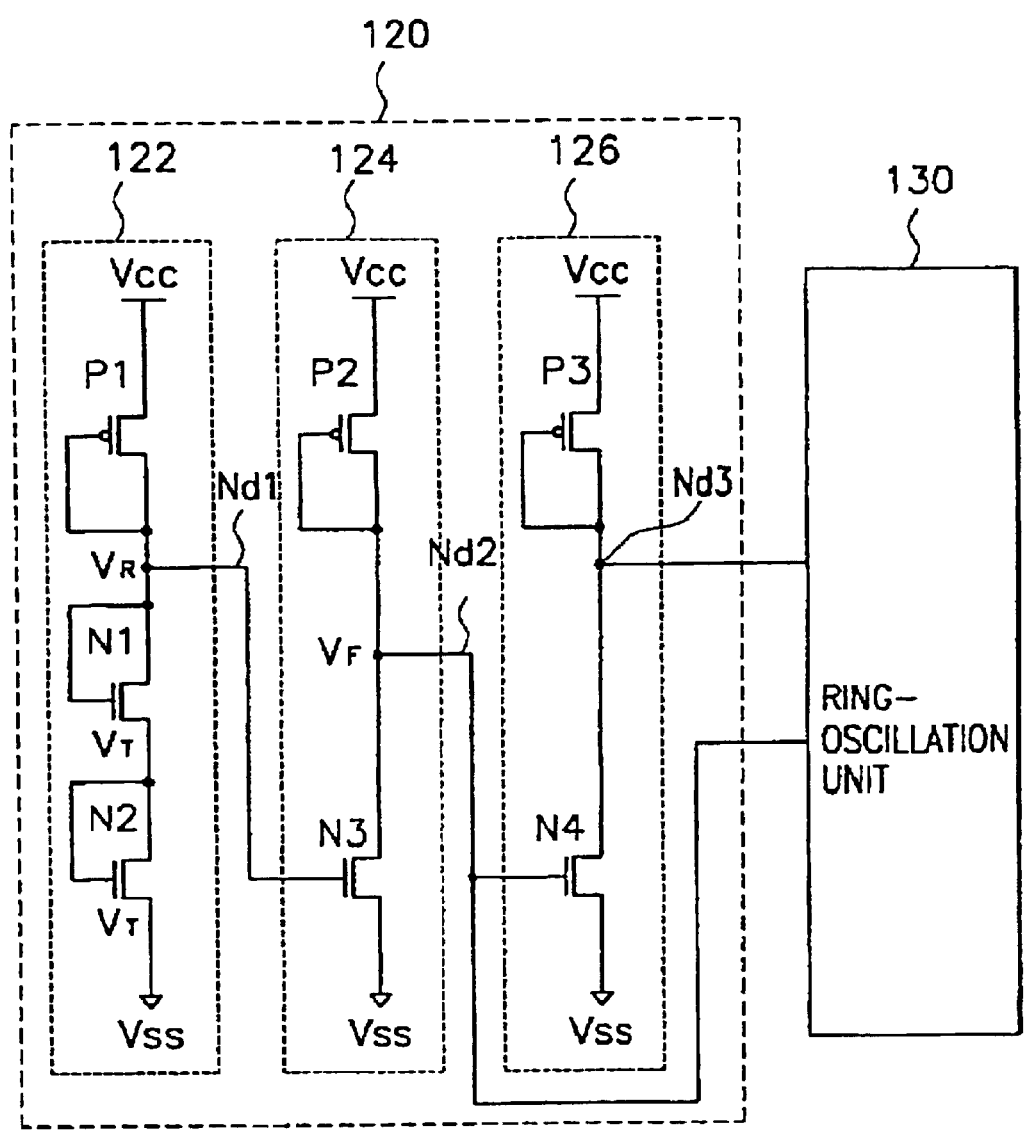
FIG. 1 illustrates a schematic configuration of a prior art self refresh circuit for a semiconductor memory device.
Figure 2A:
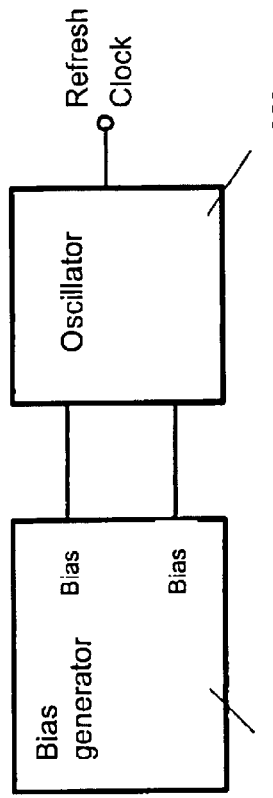
FIG. 2A is a schematic block diagram of an exemplary circuit for generating a periodic pulse signal for cell self fresh in accordance with the present invention.

FIG. 2A illustrates a schematic block diagram of an exemplary circuit for generating a periodic pulse signal for cell self refresh. The circuit comprises bias generator 200 and oscillator 250.

Bias generator 200 is adapted to accumulate leakage currents generated from one or more memory cells and generate one or more output biases for determining a self refresh period. The output biases may then be applied to oscillator 250 for generating a periodic signal pulse in response to the leakage currents.

Figure 2B:
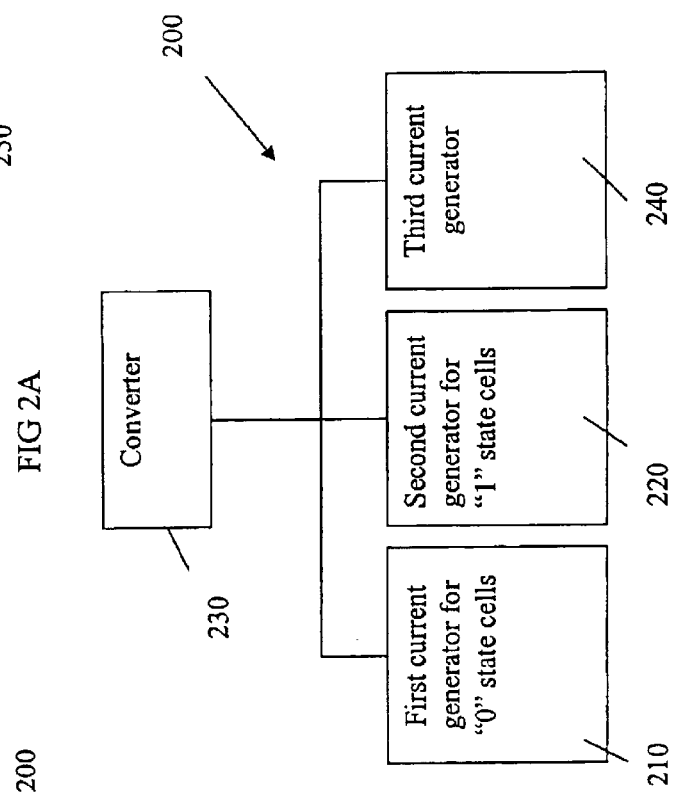
FIG. 2B is a schematic block configuration illustrating an exemplary bias generator in accordance with the present invention.

FIG. 2B is a schematic block configuration illustrating the exemplary bias generator 200 illustrated in FIG. 2A. In the embodiment illustrated in FIG. 2B, bias generator 200 comprises first current generator 210, second current generator 220, third current generator 240, and converter 230. In certain embodiments, if one leakage current fully dominates, the other current generator, e.g. 210 or 220, may not be necessary due to its negligible current contribution.

First current generator 210 is adapted to generate a first leakage current of "0" state cells.

Second current generator 220 is adapted to generate a second leakage current of "1" state cells.

Third current generator 240 is adapted to generate a third current which may be a leakage current.

Converter 230 may be present to transform the first leakage current, the second leakage current, and the third current into a current which may be output via the output biases.

Figure 3A:
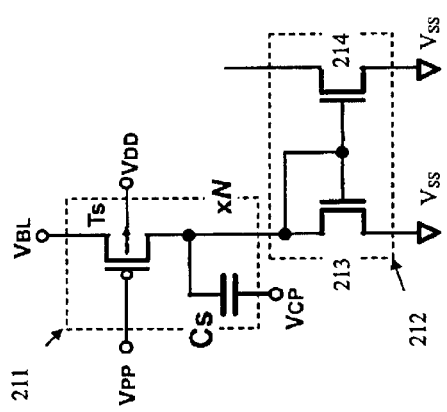
FIGS. 3A and 3B are some schematic configurations showing exemplary structures of the first current generator and the second current generator in accordance with the present invention.
Figure 3B:
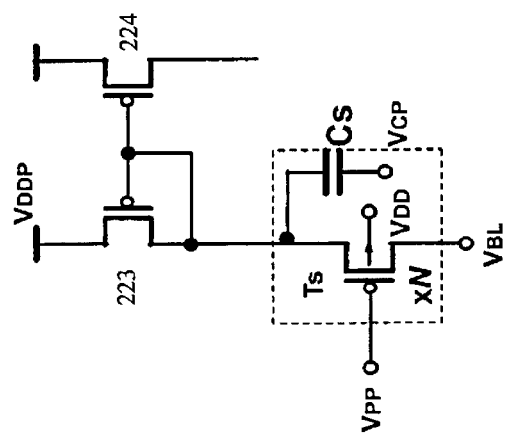

FIGS. 3A and 3B illustrate exemplary circuits for first current generator 210 and second current generator 220 using N-type and/or P-type metal-oxide-semiconductor (MOS) transistors. In these embodiments, a memory "cell" comprises a transistor and a capacitor, e.g. transistor $T_s$ and capacitor $C_s$.

Referring now to FIG. 3A, first current generator 210 comprises at least one "0" state cell 211 and first current mirror circuit 212 coupled to cell 211. In embodiments comprising PMOS transistor $T_s$, the gate terminal of each transistor $T_s$ in "0" state cell 211 may be coupled to a boosted power supply voltage, $V_{PP}$. The bulk terminal of each $T_s$ transistor in "0" state cell 211 may be coupled to a power source voltage $V_{DD}$. The source or drain terminal of each transistor $T_s$ in "0" state cell 211, depending on whether transistor $T_s$ is PMOS or NMOS, may be coupled to a bit line voltage, $V_{BL}$. Capacitor $C_s$ of each "0" state cell 211 may be coupled to a cell plate voltage, $V_{CP}$. The voltages applied to the "0" state cell 211 turns transistor $T_s$ off within the "0" state cell 211, generating the total leakage currents of the "0" state cell 211 into the first current minor circuit 212. In this embodiment, the voltages applied to the gate terminal and bulk terminal of transistor $T_s$ in each "0" state cell 211 may be interchanged so long as transistor $T_s$ is off.

In some embodiments comprising NMOS transistors, e.g. transistor $T_s$, voltages applied to the gate terminal and bulk terminal of each transistor $T_s$ in "0" state cell 211 may be replaced by a back bias voltage, $V_{BB}$, and ground voltage, $V_{SS}$, respectively, i.e. $V_{PP}$ is replaced by $V_{BB}$ and $V_{DD}$ is replaced by $V_{SS}$. $V_{BB}$ and $V_{SS}$ may be interchanged as long as transistor $T_s$ within "0" state cell 211 is off. While there is no requirement as to how many cells need to be in "0" state cell 211, it is advantageous that the magnitude of the leakage currents from "0" state cell 211 be sufficiently large to be sensed by first current mirror circuit 212.

In some embodiments, first current mirror circuit 212 comprises two MOS transistors, 213 and 214. In these embodiments illustrated in FIG. 3A, first current mirror circuit 212 comprises first NMOS transistor 213, coupled to storage node $C_s$ of "0" state cell 211, and second NMOS transistor 214, the gate of which is coupled to the gate terminal of first NMOS transistor 213. The leakage current generated from "0" state cell 211 flows through first NMOS transistor 213. First current mirror circuit 212 couples the leakage current to second NMOS transistor 214, enabling flow of a first leakage current to converter 230 (FIG. 2B).

In some embodiments, first current mirror circuit 212 may generate a weighting factor of the "0" state leakage current by using a ratio of a characteristic of first NMOS transistor 213 to a corresponding characteristic of second NMOS transistor 214, e.g. a physical characteristic. For example, if the characteristic is a physical dimension such as channel length, the first leakage current that flows through second NMOS transistor 214 may be around twice the leakage current flowing through first NMOS transistor 213 if the width of second NMOS transistor 214 is around twice the width of first NMOS transistor 213. Accordingly, the sizes of first and second NMOS transistors 213 and 214 may be used to create a current weighting factor for the "0" state cell, i.e. the ratio of their widths.

In additional embodiments, second NMOS transistor 214 may be repeated with respect to NMOS transistor 213, e.g. a number N second NMOS transistors 214 may be in parallel with respect to NMOS transistor 213 to establish N-times current through second NMOS 214. One reason is that different dimension transistors may have different characteristics.

FIG. 3B is a schematic configuration of an exemplary second current generator 220. In these embodiments illustrated in FIG. 3B, the second current generator 220 comprises at least one "1" state cell 221 and second current mirror circuit 222. Storage node $C_s$ of each "1" state cell 221 is coupled to second current mirror circuit 222. In some embodiments wherein "1" state cell 221 comprises PMOS transistors, the gate terminal of each transistor $T_s$ of "1" state cell 221 may be coupled to a boosted power supply voltage, $V_{PP}$. The bulk terminal of each transistor $T_s$ of "1" state cell 221 may be coupled to a power source voltage $V_{DD}$. The source or drain terminal of each "1" state cell 221 is coupled to a bit line voltage, $V_{BL}$, and the capacitor of each transistor $T_s$ of "1" state cell 221 may be coupled to a cell plate voltage, $V_{CP}$. Voltages applied to "1" state cell 221 turn transistor $T_s$ off, generating the total leakage current of the "1" state cell 221 into second current mirror circuit 222. In these embodiments, the voltages applied to the gate terminal and the bulk terminal of each transistor $T_s$ of "1" state cell 221 may be interchanged so long as transistor $T_s$ is off.

In some embodiments wherein "1" state cell 221 comprises NMOS transistors, voltages applied to the gate terminal and bulk terminal of each transistor $T_s$ of "1" state cell 211 may be replaced by a back bias voltage, $V_{BB}$, and ground voltage, $V_{SS}$, respectively. In some embodiments, $V_{BB}$ and $V_{SS}$ may be interchanged. There is no requirement how many cells be in the at least one "1" state cell 221, but it is advantageous that the amount of the leakage currents from the cells be high enough to be sensed by the second current mirror circuit 222.

In the embodiments illustrated in FIG. 3B, second current mirror circuit 222 comprises two PMOS transistors 223 and 224. First PMOS transistor 223 is coupled to storage node $C_s$. The gate terminal of second PMOS transistor 224 is coupled to the gate terminal of first PMOS transistor 223. The leakage current generated from the "1" state cell 221 flows through first PMOS transistor 223. Second current mirror circuit 222 then couples the leakage current to the second PMOS transistor 224 creating a second leakage current flow to converter 230 (FIG. 2B).

In some embodiments, second current mirror circuit 222 can generate a weighting factor of "1" state cell 221 by using a ratio of a characteristic of first PMOS transistor 223 to a corresponding characteristic of second PMOS transistor 224. For example, second leakage current flowing through second NMOS transistor 224 may be around twice the leakage current flowing through first PMOS transistor 223 if the width of second PMOS transistor 224 is twice the width of first PMOS transistor 223.

Referring back to FIG. 2B, third current source generator 240 is adapted to generate a third current. Third current source generator 240 may be used as a constant reference source to establish a DC current level which allows current source control oscillator 200 to produce a constant period signal pulse. In other embodiments, third current source generator 240 may be a variable current source where the current varies with some other operational factors, e.g. temperature or operation voltage. In further embodiments, third current generator 240 is a further source of leakage current.

While there is no requirement that third current generator 240 be included in bias generator 200, in some embodiments, third current generator 240 may improve accuracy of the self refresh period if it is properly applied in bias generator 200. For example, the third current may vary with operational factors, e.g. temperature or operation voltage, that affect the leakage current within the DRAM. Third current source generator 240 may therefore generate different currents which may be used to modify the output biases when determining a self refresh period for the DRAM. Moreover, third current generator 240 may also generate a current weighting factor, for example by using a mirror circuit.

Figure 4A:
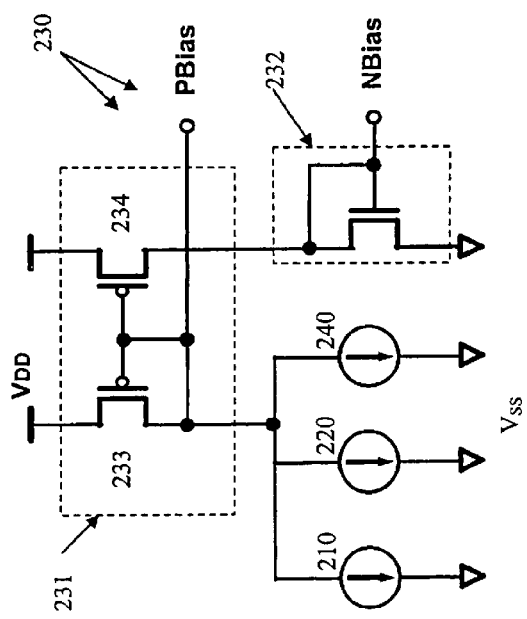
FIGS. 4A and 4B are schematic configurations of exemplary converters in accordance with the present invention.
Figure 4B:
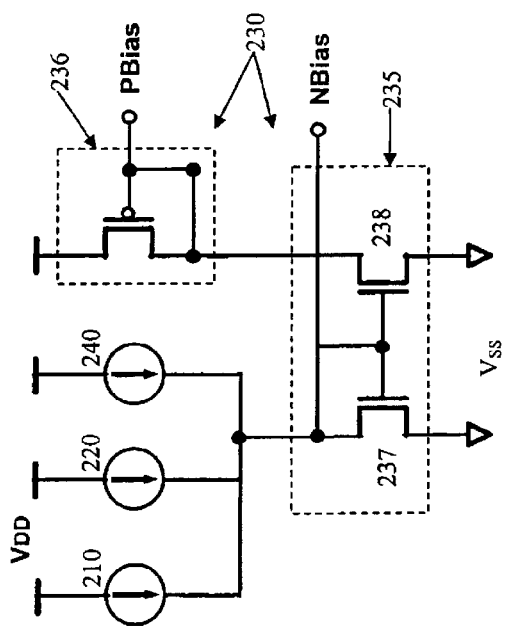
Figure 5:
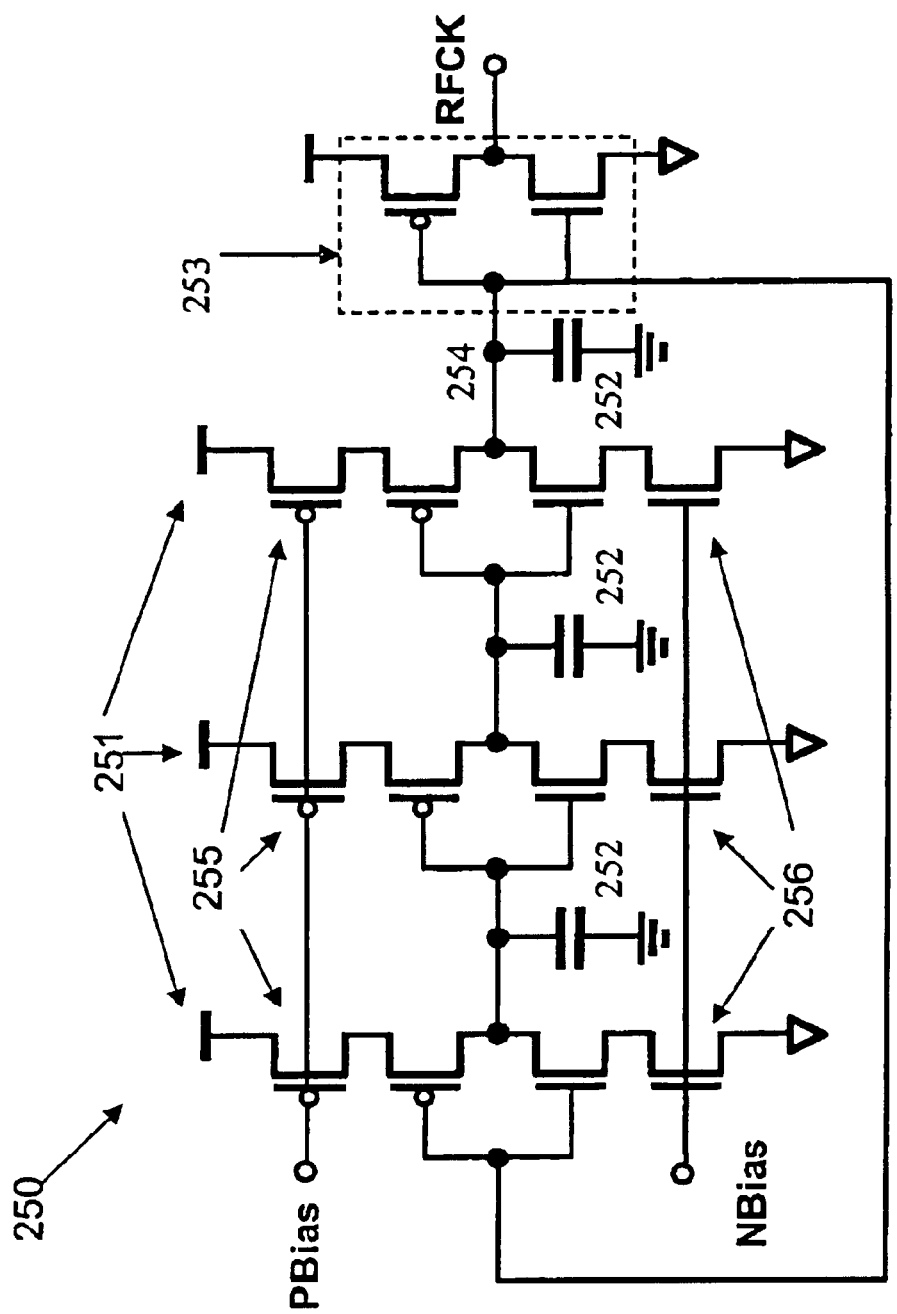
FIG. 5 is a schematic configuration illustrating an exemplary oscillator in accordance with the present invention.

FIGS. 4A and 4B illustrate schematic configurations of exemplary converters 230 that may be coupled to first current generator 210, second current generator 220, and third current generator 240. In the embodiment illustrated in FIG. 4A, current generators 210, 220 and 240 share a common ground. In these embodiments, converter 230 transforms leakage currents generated from current generators 210 and 220 as well as current from current generator 240 into output biases for controlling oscillator 250 (FIG. 5).

In the embodiment of FIG. 4A, converter 230 comprises third current mirror circuit 231 and MOS transistor 232. MOS transistor 232 is an NMOS transistor whose gate terminal and drain terminal are coupled to each other.

In some embodiments, third current mirror circuit 231 comprises a pair of MOS transistors 233 and 234, e.g. PMOS transistors 233 and 234. Third current mirror circuit 231 collects the total current generated from first current generator 210, second current generator 220, and third current generator, and couples the total current of PMOS transistor 234 to the current flowing through NMOS transistor 232. In the embodiment illustrated in FIG. 4A, the drain terminal and the gate terminal of PMOS transistor 233 are coupled to the gate terminal of PMOS transistor 234. PMOS transistor 233 may be used to generate a first output bias, P-bias, to an oscillator (not illustrated) based on the current flowing through PMOS transistor 233.

The drain terminal and gate terminal of NMOS transistor 232 are coupled to each other. NMOS transistor 232 may be used to generate a second output bias, N-bias, to an oscillator (not illustrated) based on the coupled leakage current flowing through NMOS transistor 232.

Third current mirror circuit 231 may generate P-Bias, N-Bias, or a combination thereof.

In the embodiment illustrated in FIG. 4B, the current generators 210, 220 and 240 are common to $V_{DD}$. In some embodiments, the converter 230 comprises a third current mirror circuit 235 and a MOS transistor 236. In the embodiment of FIG. 4A, the MOS transistor 236 is a PMOS transistor. Moreover, the gate terminal and drain terminal of the PMOS transistor 236 are common. In some embodiments, the third current mirror circuit 235 comprises a pair of MOS transistors 237 and 238. In the embodiment illustrated in FIG. 4B, the pair of MOS transistors are NMOS transistors. The third current mirror circuit 235 collects the total leakage current generated from the first current generator 210, second current generator 220 and third current generator, and couples the total leakage current to the NMOS transistor 238 and flowing through the PMOS transistor 236. In the embodiment illustrated in FIG. 4B, the drain terminal and the gate terminal of the NMOS transistor 237 ae coupled to the gate terminal of the NMOS transistor 238. The NMOS transistor 237 generates a first output bias, or called N-bias, based on the current flowing through the NMOS transistor 237. N-bias may be coupled to a further circuit such as an oscillator (not illustrated). The drain terminal and gate terminal of the PMOS transistor 236 are common. The PMOS transistor 236 generates a second output bias, or called P-bias, to an oscillator (not illustrated) based on the coupled leakage current flowing through the PMOS transistor 236.

FIG. 5 is a schematic configuration illustrating an exemplary oscillator which may be used to generate a periodical signal pulse in response to the biases generated from bias generator 200 (FIGS. 4A and 4B), e.g. N-bias and/or P-bias. Oscillator 250 comprises a ring of current inverters 251 and capacitors 252. In certain contemplated embodiments, oscillator 250 further comprises inverter 253.

Current inverters 251 comprise PMOS transistors 255 and NMOS transistors 256. The gate terminal of each PMOS transistor 255 may be coupled to the P-bias generated from bias generator 200. The gate terminal of each NMOS transistor 256 is coupled to the N-bias generated from bias generator 200 (FIGS. 4A and 4B). While there is no requirement as to how many current inverters 251 need to be included in oscillator 250, in a preferred embodiment the total number of current inverters 251 should be odd. The number of current inverters 251 may depend, for example, on the complexity of circuit layout, the performance of the oscillator, and/or the physical area required by oscillator 250.

Output terminal 254 of a current inverter 251 may be coupled to the input terminal of another current inverter 251 and/or to one of capacitors 252. If inverter 253 is present, output terminal 254 of at least one current inverter 251 is coupled to inverter 253.

In some embodiments, capacitors 252 may be external capacitors or inherent parasitic capacitors of current inverters 251 as opposed to discrete structures fabricated with oscillator 250.

Inverter 253 may be present and able to modify the shape of the periodical refresh pulse generated from current inverters 251, thereby generating a sharper periodical refresh pulse.

A refresh clock for cell self refresh may be created by using N-bias and P-bias generated from bias generator 200 (FIGS. 4A and 4B) to control the operation of current inverters 251. By controlling current inverters 251, a periodical refresh pulse is created and output to inverter 253 which may then modify the shape of the pulse.

Figure 6A:
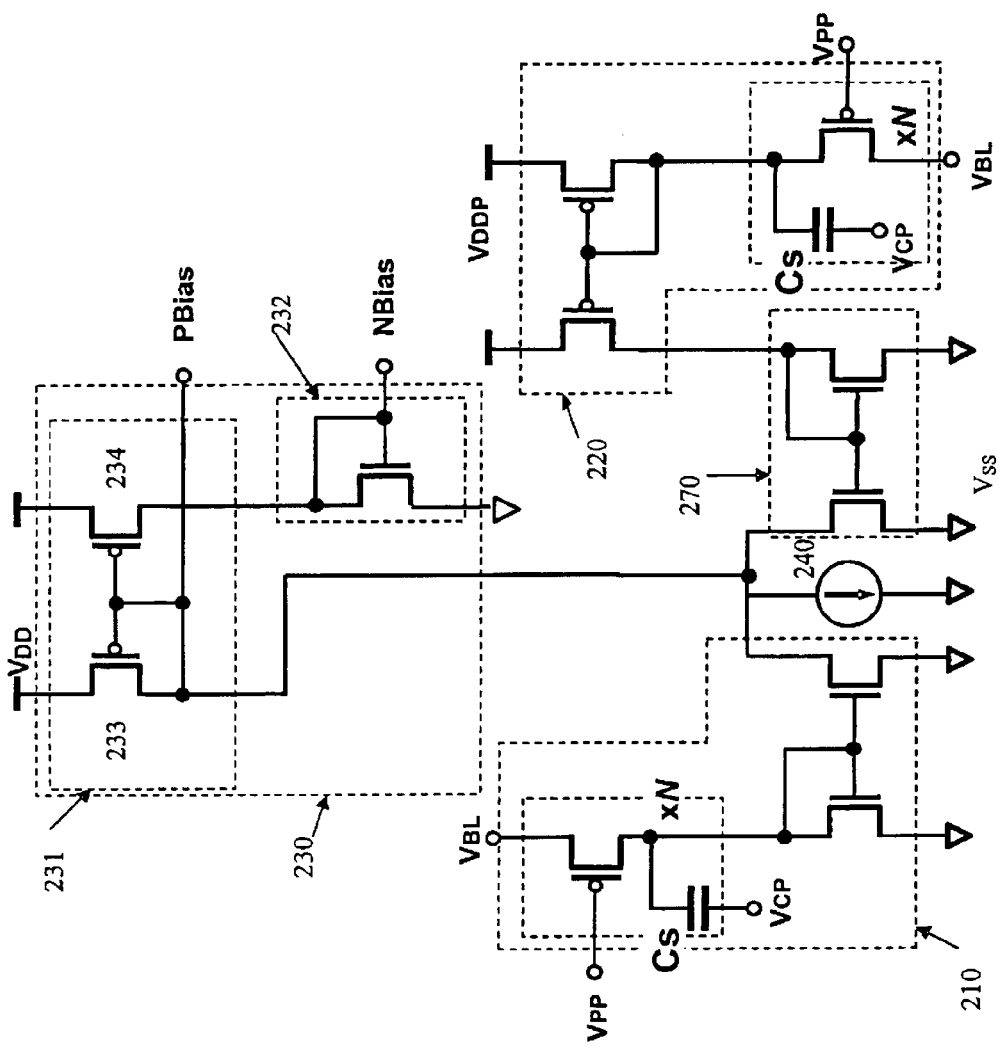
FIGS. 6A and 6B are schematic configurations of exemplary circuits for generating periodical refresh pulses for different type cells in accordance with the present invention.
Figure 6B:
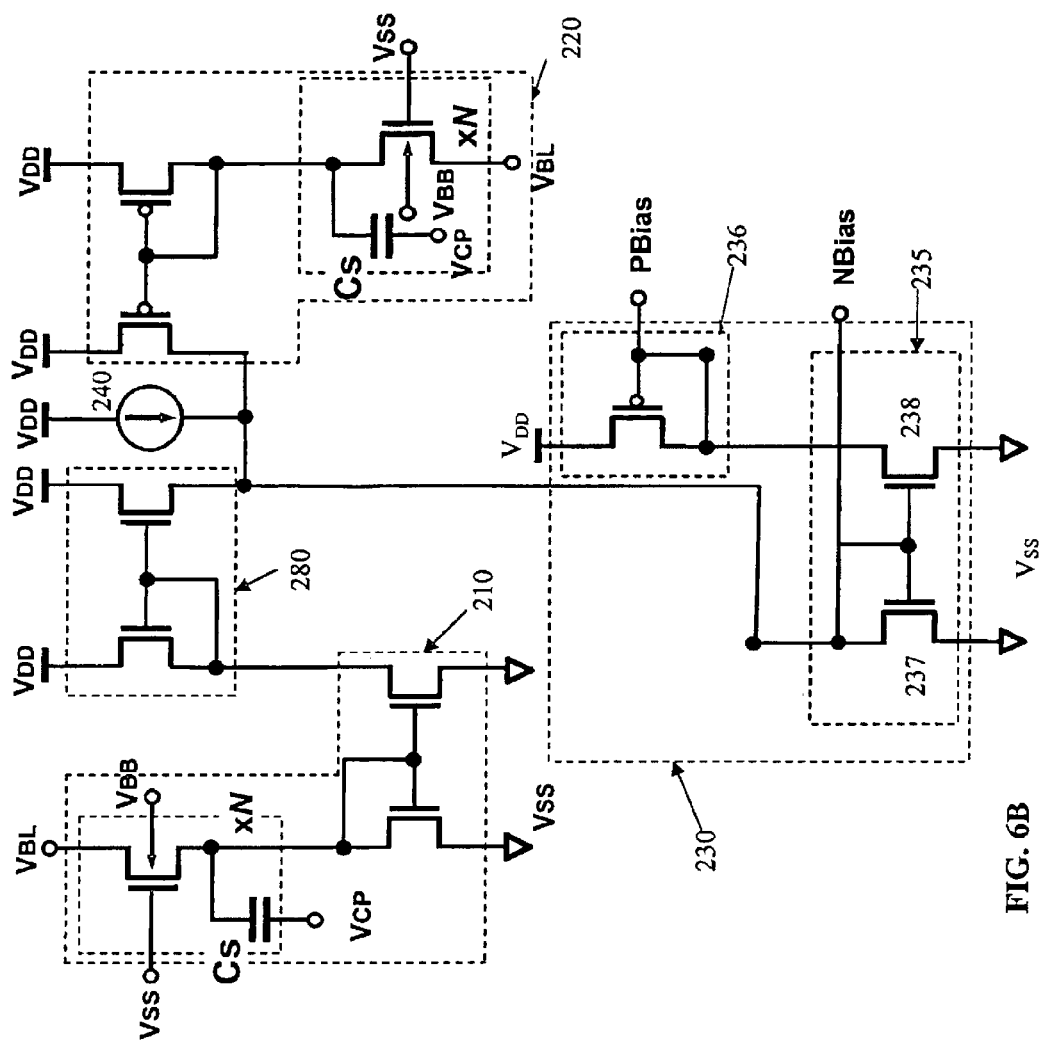

FIGS. 6A and 6B illustrate schematic configurations of exemplary circuits for generating periodical refresh pulses for different type cells.

In the embodiment illustrated in FIG. 6A, the DRAM cells comprise PMOS transistors. An exemplary circuit for generating periodical refresh pulses comprises first current generator 210 for generating a first leakage current of "0" state cells, second current generator 220 for generating a second leakage current of "1" state cells, third current generator 240 for generating a third leakage current, and converter 230 for transforming a current comprising the first leakage current, the second leakage current and the third leakage current into output biases PBias and NBias.

In the embodiment, the current generators are coupled to $V_{SS}$, e.g. ground. Third mirror circuit 270 may be present to couple the leakage current of "1" state cells to converter 230 because second current generator 220 is coupled to $V_{SS}$.

As illustrated in FIG. 6B, in embodiments comprising NMOS transistor cells, an additional mirror circuit 280 couples the leakage current of "1" state cells to converter 230 because first current generator 210 is coupled to $V_{DD}$.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A bias generator for cell self refresh, comprising:
   a. a first current generator for generate a first leakage current for "0" state cells;
   b. a second current generator for generate a second leakage current for "1" state cells; and c. a converter coupled to the first and second current generators for transforming a current comprising the first leakage current and the second leakage current into an output bias.

2. The bias generator of claim 1 further comprising a third current generator coupled to the converter, the third current generator adapted to generate a third current and provide the third current to the converter.

3. The bias generator of claim 1, wherein the first current generator comprises:
   a. a "0" state cell, further comprising a storage node; and
   b. a first current mirror circuit coupled to the storage node.

4. The bias generator of claim 3, wherein the first current mirror circuit further comprises:
   a. a first metal-oxide-semiconductor (MOS) transistor coupled to the storage node; and
   b. a second MOS transistor coupled to the converter.

5. The bias generator of claim 4, wherein the first and second MOS transistors are NMOS transistors.

6. The bias generator of claim 5, wherein the first current mirror circuit is further adapted to generate a current weighting factor utilizing a ratio of a physical characteristic of the first NMOS transistor and a physical characteristic of the second NMOS transistor.

7. The bias generator of claim 1, wherein the second current generator further comprises:
   a. a "1" state cell, further comprising a storage node; and
   b. a second current mirror circuit coupled to the storage node.

8. The bias generator of claim 7, wherein the second current mirror circuit further comprises:
   a. a first MOS transistor coupled to the storage node; and
   b. a second MOS transistor coupled to the converter.

9. The bias generator of claim 8, wherein the first and second MOS transistors of the second current mirror circuit are PMOS transistors.

10. The bias generator of claim 9, wherein the second current mirror circuit is adapted to generate a current weighting factor utilizing a ratio a physical characteristic of the first PMOS transistor and a physical characteristic of the second PMOS transistor.

11. The bias generator of claim 1, wherein the converter further comprises:
    a. a third current mirror circuit; and
    b. a common gate transistor.

12. The bias generator of claim 11, wherein the third current mirror circuit comprises a pair of same type MOS transistors.

13. The bias generator of claim 1, wherein the output bias comprises at least one of (i) an NBias or (ii) a PBias.

14. A circuit for generating a periodic pulse signal for cell self refresh, comprising:
    a. a bias generator for accumulating a leakage current generated from a memory cell and further for generating an output bias for determining a self refresh period; and
    b. an oscillator for generating a periodical signal pulse in response to the output bias.

15. The circuit of claim 14 wherein the bias generator further comprises:
    a. a first current generator adapted to generate a first leakage current for a "0" state cell;
    b. a second current generator adapted to generate a second leakage current for a "1" state cell; and
    c. a converter coupled to the first and second current generators, the converter adapted to transform a current comprising the first leakage current and the second leakage current into the output bias.

16. The circuit of claim 15 further comprising a third current generator, coupled to the converter and adapted to generate a third leakage current and provide the third leakage current to the converter.

17. The circuit of claim 15, wherein the first current generator further comprises:
    a. a "0" state cell, further comprising a storage node; and
    b. a first current mirror circuit coupled to the storage node.

18. The circuit of claim 17, wherein the first current mirror circuit further comprises:
    a. a first metal-oxide-semiconductor (MOS) transistor coupled to the storage node; and
    b. a second MOS transistor coupled to the converter.

19. The circuit of claim 18, wherein the first and second MOS transistors are NMOS transistors.

20. The circuit of claim 18, wherein the first current mirror circuit is adapted to generate a current weighting factor utilizing a ratio of a physical characteristic of the first NMOS transistor to a physical characteristic of the second NMOS transistor.

21. The circuit of claim 15, wherein the second current generator comprises:
    a. a "1" state cell, further comprising a storage node; and
    b. a second current mirror circuit coupled to the storage node.

22. The circuit of claim 21, wherein the second current mirror circuit further comprises:
    a. a first MOS transistor coupled to the storage node; and
    b. a second MOS transistor coupled to the converter.

23. The circuit of claim 22, wherein the first and second MOS transistors are PMOS transistors.

24. The circuit of claim 23, wherein the second current mirror circuit is adapted to generate a current weighting factor utilizing a ratio of a physical characteristic of the first PMOS transistor to a physical characteristic of the second PMOS transistor.

25. The circuit of claim 15, wherein the converter further comprises:
    a. a third current mirror circuit; and
    b. a common gate transistor.

26. The circuit of claim 25, wherein the third current mirror circuit further comprises a pair of same type MOS transistors.

27. The circuit of claim 15, wherein the output bias comprises at least one of (i) a PBias or (ii) an NBias.

28. A method for generating a periodic pulse signal for cell self refresh, comprising:
    a. generating a leakage current from a memory cell;
    b. transforming the leakage current into an output bias for determining a self refresh period; and
    c. using the output bias to control an oscillator for generating a periodical signal pulse in response to the leakage current.

29. The method of claim 28, wherein generating a leakage current from a memory cell further comprises:
    a. generating a first leakage current of a "0" state cell; and
    b. generating a second leakage current of a "1" state cell.

30. The method of claim 29, wherein generating a leakage current from a memory cell further comprises generating a third current.

31. The method of claim 29 further comprising connecting a storage node of the "0" state cell to a first current mirror circuit.

32. The method of claim 31 further comprising using the first current mirror circuit to generate a first current weighting factor.

33. The method of claim 29 further comprising connecting a storage node of the "1" state cell to a second current mirror circuit.

34. The method of claim 33 further comprising using the second current mirror circuit to generate a second current weighting factor.

35. A bias generator for cell self refresh for a semiconductor memory comprising a "0"state cell, for providing a first leakage current and a "1" state cell, for providing a second leakage current, where one of the first or second leakage currents dominates over the other of the first or second leakage currents, the bias generator comprising:
  a. a current generator for generating a third leakage current for a dominant leakage current from a memory cell; and
  b. a converter coupled to the current generator for transforming the third leakage current into an output bias.

* * * * *

UNITED STATES PATENT AND TRADEMARK OFFICE
CERTIFICATE OF CORRECTION

PATENT NO. : 6,862,239 B1
DATED : March 1, 2005
INVENTOR(S) : Chien-Hua Huang and Chung-Cheng Chou It is certified that error appears in the above-identified patent and that said Letters Patent is hereby corrected as shown below:

Column 5,
Line 51, delete "ae" and insert therefor -- are --;

Column 6,
Lines 64 and 66, delete both occurrences of "generate" and insert therefor
-- generating --.

Signed and Sealed this

Seventeenth Day of May, 2005

JON W. DUDAS
*Director of the United States Patent and Trademark Office*